United States Patent

Dalmasso et al.

[15] 3,673,309

[45] June 27, 1972

[54] INTEGRATED SEMICONDUCTOR CIRCUIT PACKAGE AND METHOD

[72] Inventors: Claudio Dalmasso, Turin, Italy

[73] Assignee: Ing. C. Olivetti & C., S.p.A., Turin, Italy

[22] Filed: Nov. 3, 1969

[21] Appl. No.: 873,499

[30] Foreign Application Priority Data

Nov. 6, 1968 Italy ........................53759 A/68

[52] U.S. Cl. ..................174/52 PE, 29/588, 174/DIG. 3, 317/101 CC, 317/234 E, 317/234 G

[51] Int. Cl. ............................................H05k 5/02

[58] Field of Search ..................174/52.5, 52.6; 317/101 A, 317/101 CP, 101 C, 101 CC, 234 E, 234 H; 29/588–589

[56] References Cited

UNITED STATES PATENTS

| | | | |
|---|---|---|---|
| 3,317,653 | 5/1967 | Layer, Jr. et al. | 174/68.5 |
| 3,331,125 | 7/1967 | McCusker | 317/235 D UX |
| 3,404,215 | 10/1968 | Burks et al. | 174/DIG. 3 UX |
| 3,495,023 | 2/1970 | Hessinger et al. | 174/DIG. 3 UX |
| 3,560,256 | 2/1971 | Abrams | 317/101 A |
| 3,371,148 | 2/1968 | Roques et al. | 174/DIG. 3 |
| 3,374,537 | 3/1968 | Doelp, Jr. | 174/52.5 X |
| 3,469,148 | 9/1969 | Lund | 174/52.6 X |

*Primary Examiner*—Darrell L. Clay
*Attorney*—Irons, Birch, Swindler & McKie

[57] ABSTRACT

An integrated circuit package features a hermetically sealed cap bonded to a substrate by a printed glass frame. Printed circuit metallization extends under the cap and frame from the central area of the substrate surface to the edge of the surface. Connecting lugs are bonded to this metallization at the extremities of the substrate surface. At the central area of the substrate surface, the means for connecting the inner portion of the metallization to the integrated circuit terminals traverses and insulated support member. The printed metallization paths can cross each other and are insulated by printed insulation at the crossing points.

20 Claims, 29 Drawing Figures

Patented June 27, 1972 3,673,309

15 Sheets-Sheet 1

INVENTOR.
CLAUDIO DALMASSO

*INVENTOR*
CLAUDIO DALMASSO

*INVENTOR.*
CLAUDIO DALMASSO

Patented June 27, 1972

3,673,309

15 Sheets-Sheet 4

INVENTOR.
CLAUDIO DALMASSO

INVENTOR
CLAUDIO DALMASSO

*INVENTOR.*
CLAUDIO DALMASSO

INVENTOR.
CLAUDIO DALMASSO

INVENTOR.
CLAUDIO DALMASSO

INVENTOR
CLAUDIO DALMASSO

INVENTOR.
CLAUDIO DALMASSO

Patented June 27, 1972 3,673,309

15 Sheets-Sheet 11

INVENTOR.
CLAUDIO DALMASSO

INVENTOR
CLAUDIO DALMASSO

INVENTOR
CLAUDIO DALMASSO

Patented June 27, 1972

3,673,309

15 Sheets-Sheet 14

INVENTOR.
CLAUDIO DALMASSO

*INVENTOR*
CLAUDIO DALMASSO

INTEGRATED SEMICONDUCTOR CIRCUIT PACKAGE AND METHOD

BACKGROUND OF THE INVENTION

1. Field of the Invention

The present invention relates to an airtight container for integrated semiconductor circuits and to the method by which the same is assembled.

2. Prior Art

One of the problems that exists in the integrated circuit packaging art is that of connecting the terminals of the chip to the electrical conductors which extend from the interior of the package. The means for connecting the terminals to the conductors must, in many applications, be disposed to not make contact with the edges of the chip. If the edge of the chip is contacted, a short circuit would result, which would damage or destroy the chip.

The solutions to this problem presented in the prior art are impractical in that they raise the manufacturing costs considerably. One prior art technique is to hollow out a portion of the substrate and to place the chip in this hollowed portion so that the sides of the chip are not higher than the edges of the hollowed portion. Another technique is to use stiff metal pieces as the connecting means. Since the stiff metal does not sag, the side edges of the chip will not be touched.

Further, prior art packages are susceptible to failures caused by moisture seepage which can occur after the mounting lugs have been subjected to strong mechanical shock. The shock causes tiny cracks to appear between the encapsulant and the lugs, which cracks allow moisture to enter the circuit chamber.

Another disadvantage found in prior art packages is that the metallization pattern is a single layer; single layer patterns restrict design flexibility in that the sequence of terminal lugs is fixed by the type of chip utilized and the external circuit environment must be designed to correspond with this fixed sequence.

The airtight containers for semiconductors which are available on the market have the disadvantages of having: a high production cost and also being equipped with a type of terminal which is not always suited to the external electronic circuit environments employed.

SUMMARY OF THE INVENTION

The disclosed inventive concepts alleviate the above-mentioned and other problems inexpensively and reliably.

In order to prevent the connecting wires from contacting the chip's surface an insulating member (e.g. a plastic ring) is located around the sides of the circuit chip, the chip being previously affixed to the surface of the substrate. Thereafter, the connecting means (e.g. wires) are extended across the top of this ring and bound to the terminals of the chip and to the printed metallization which leads to the exterior of the package. Another related method of connecting the chip to the conductors utilizes, instead of wires, a thin framework of conductive material (e.g. aluminum). The aluminum strips are connected to one or two plastic frames on which adhesive material has been deposited; these frames serve to support the strips and to provide a method whereby the strips can be quickly and easily placed in proper position relative to the terminals and the conductors prior to bonding.

In order to insure air and moisture tightness, a glass sealing frame is printed about the circuit blocks and over the printed metallization. The ends of the printed metallization are connected to external mounting lugs; these lugs, which are often subjected to mechanical shock, can be selected with a view toward strength and corrosion resistivity. Since these lugs are connected only to the edge of the substrate, they need not match the substrate's coefficient of expansion. Any moisture which enters the package along the surface of these lugs is stopped by the printed glass frame. The glass frame forms an ideal airtight seal since it is printed over the printed metallization. Both the printed metallization and the printed frame are glass suspensions; they will fuse, thereby insuring that no minute traces of moisture can enter the circuit chamber.

Another aspect of the invention concerns the crossover metallization pattern. Instead of printing the metallization in a single layer with the various metallization strips radiating outward from the circuit chip to the substrate edges, the invention contemplates the crossing of metallization strips over each other with printed insulation being deposited between the strips at their points of intersection.

Specifically, an integrated circuit container has been invented which has available $n$ lugs (for example $n = 40$) disposed on a grid of uniform spacing (for example 1/10 inch). The lugs are directed in a sense perpendicular to the plane of the container, thereby allowing the container to be soldered to a printed circuit which has through holes therein, with the possibility of running a connecting path between each pair of lugs. On constructing this container in order to achieve the maximum economy of preparation, it is necessary to exclude the use of any type of printed or sintered window of glass or alumina (currently used in the containers on the market) and the use of Kovar (Trade Mark) or similar materials must be restricted to the essential minimum.

According to the invention there is provided a container for an integrated semiconductor circuit comprising a ceramic base, bearing on one face a pattern of printed conductors which extend between a central zone, and the peripheral portions of the base. Integrated circuits are affixed in the central zone and are connected to the inner ends of the conductors. Metal lugs are soldered to the outer ends of the conductors. A glass frame is printed to cover the printed conductors in the portion between the said inner ends and peripheral portions, and a metal cover having a peripheral rim adapted to be soldered or bonded to the glass frame is affixed.

The container according to the invention can make use of automated silk screen printing operations for the major part of its preparation.

The container according to the invention enables more than one integrated-circuit block to be enclosed in a single container; required interconnections are made inside the container and only those signals which require an external connection are carried to the lugs.

It is therefore an object of the present invention to provide an integrated circuit package which is hermetically sealed and of high reliability.

A further object is to provide a package which conveniently provides for flexibility of design.

A further object is to provide a technique of connecting integrated circuit chips to the package terminals.

A further object is to provide a package which can be conveniently and reliably affixed to a variety of external circuit environments.

Other objects will appear hereafter.

DETAILED DESCRIPTION OF THE DRAWINGS

Figure 1:
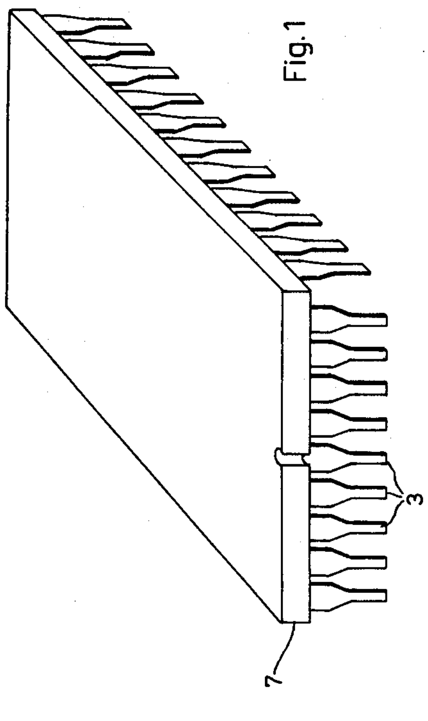
FIG. 1 is a perspective view of a container for integrated semiconductor circuits.

By way of example, there will now be described in detail a container having for example, 40 tags or lugs 3 (FIG. 1). The container is composed of the following parts.

- a ceramic base 1 bearing the silk-screen printing hereinafter specified (FIGS. 2 and 3):
- group of lugs 3 of gold-plated metal (typically Phosphor bronze) FIGS. 1, 2 and 4);
- a protective cover 4 of Kovar, gold-plated at the soldering rim 5 (FIGS. 2, 5*a* and 5*b*);
- a soldering ring 6 (FIGS. 2 and 6) (which may be eliminated in other embodiments in the manner which will be described hereinafter).

The closed container assumes the outward appearance of FIG. 1 and the appearance in section of FIG. 2; it may be subsequently encased in plastics material 7 (silicone or epoxide resin) which increases the mechanical strength and the moisture-tightness thereof (especially if hermetic soldering of the cover 4 is not used).

The essential characteristic for the purposes of good moisture-tightness consists in having eliminated every glass-to-metal weld around the lugs and, therefore, every possibility of opening up paths for the penetration of moisture through minute cracks opened in the glass by mechanical stresses applied to the lugs.

A detailed description of the individual parts will now be given.

The base 1 of the container is formed of a ceramic with a high alumina content (85–97 percent) having a surface roughness ranging between 1 and 2 microns and a flatness better than 0.05 mm on the diagonal. The thickness may be taken to be from 0.5 to 1.5 mm, but to proceed usefully with the following printing operations the thicknesses of the various pieces in the batch must keep to a tolerance of ±0.03 mm.

The system of connecting conductors 8 between the integrated circuit block or blocks, which are mounted in the central zone of the base, and the peripheral broadened portions 9 to which the lugs are soldered is produced by means of silk screen printing operations, using vitrifying conductive pastes of high conductivity. One or more layers or coats of print may be produced, according to the result to be obtained. In the simplest case, a single layer which forms the entire interconnection pattern (FIG. 3) is printed. The paste used must have optimum adhesion to the ceramic.

After the printing, the bases 1 are dried at 125° C for 2 hours and then fired in a continuous kiln in accordance with the temperature pattern advised for the specific paste used. More particularly, it has been found by testing that commercially available paste, fired at a maximum temperature of 1,050° C for 10 minutes and with heating up and cooling times of 30 minutes, in addition to having optimum adhesion to the alumina ceramic also lends itself well to all the operations that follow and has the following advantages: it does not ebb or flow back in the following firings of other pastes; it accepts the soldering of the lugs with an alloy of 59 percent Sn, 39 percent Pb and 2 percent Ag; it accepts the soldering of the integrated circuits through the medium of a ring of Sn (which may also be screen-printed) or of eutectic Au – Sn; it accepts the thermocompression of gold wires; it accepts the ultrasonic soldering of integrated-circuit blocks and of gold wires and wires of Au–Si.

Figure 8A:
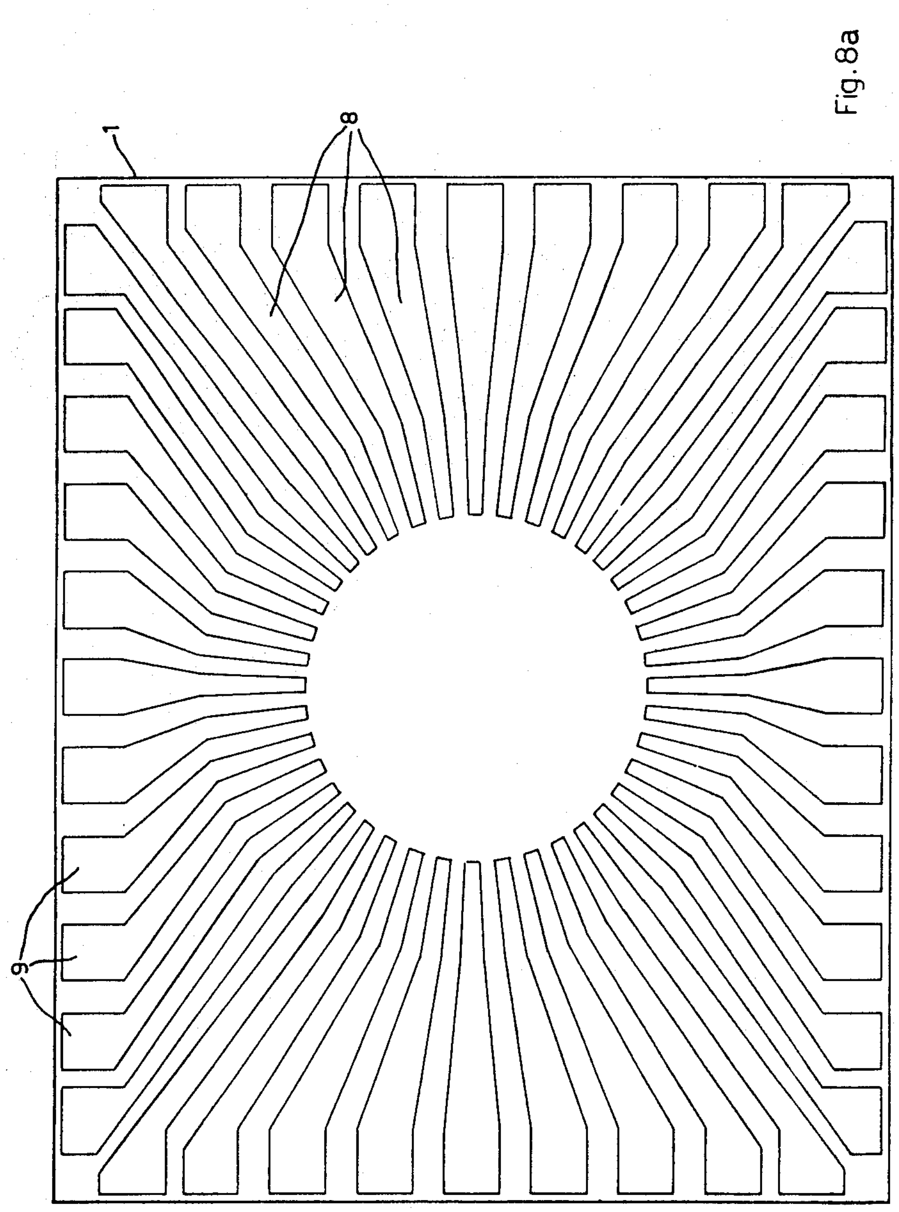
FIGS. 8*a*, 8*b* and 8*c* are plan views of a base, and conductors thereon included in the container illustrated in FIG. 7.
Figure 8B:
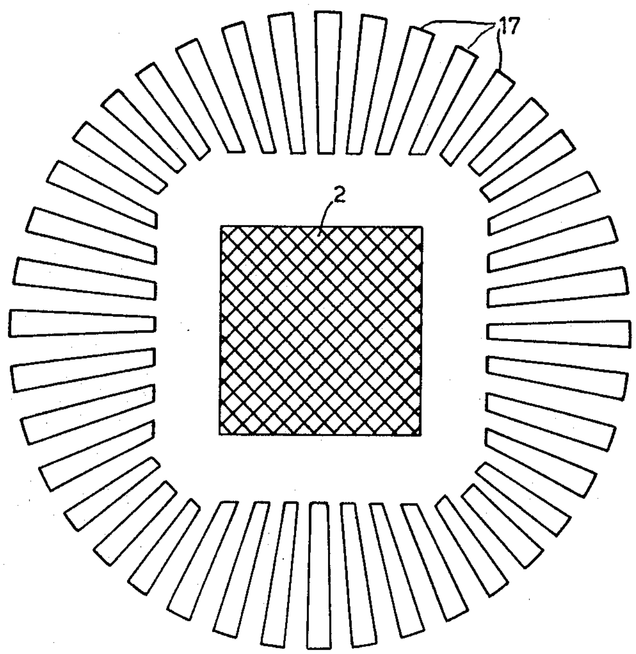
Figure 8C:
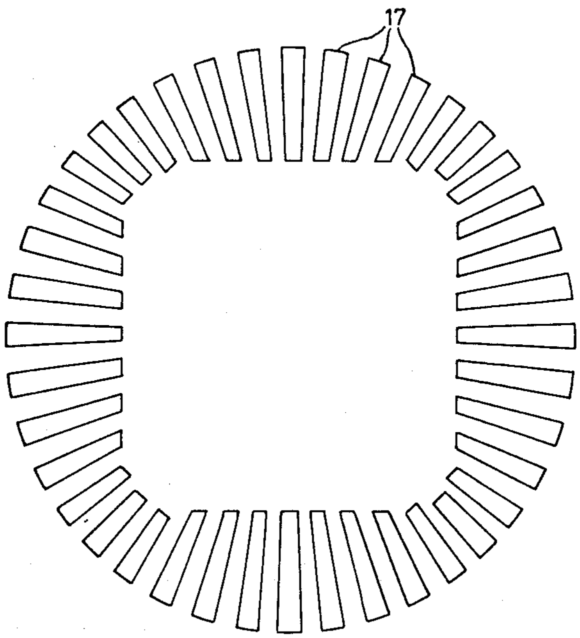
Figure 9A:
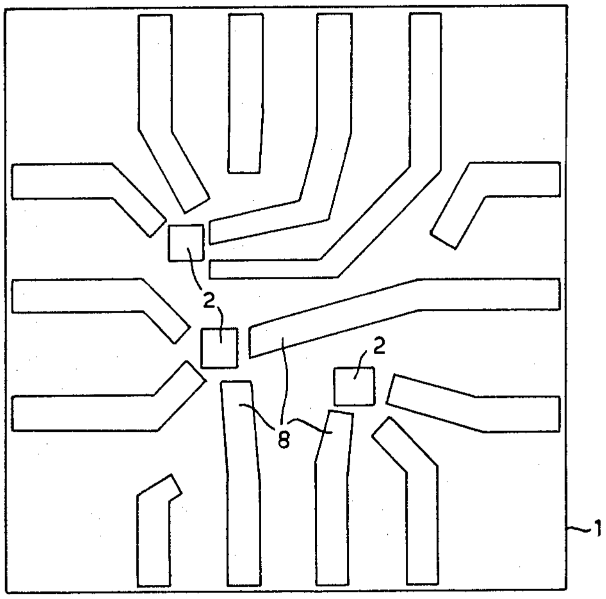
FIGS. 9*a*, 9*b* and 9*c* show a base included in the containers illustrated in FIG. 2 or FIG. 7 and on which successive printings of conductors are effected by means of a silk screen printing process.
Figure 9B:
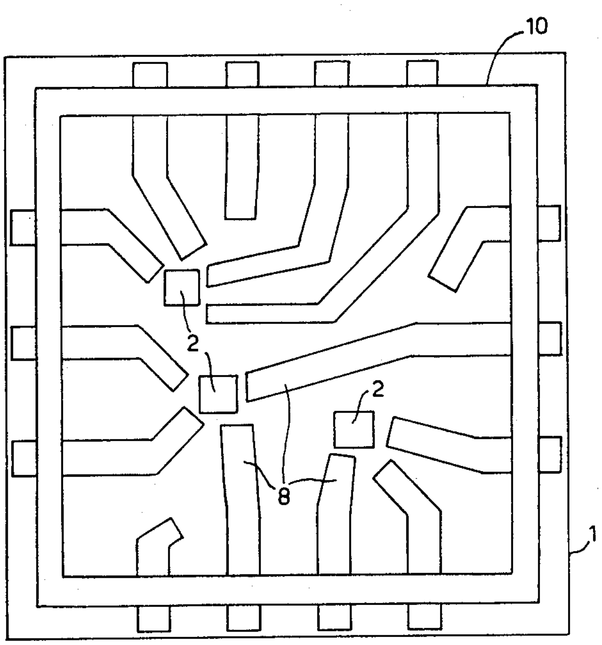
Figure 9C:
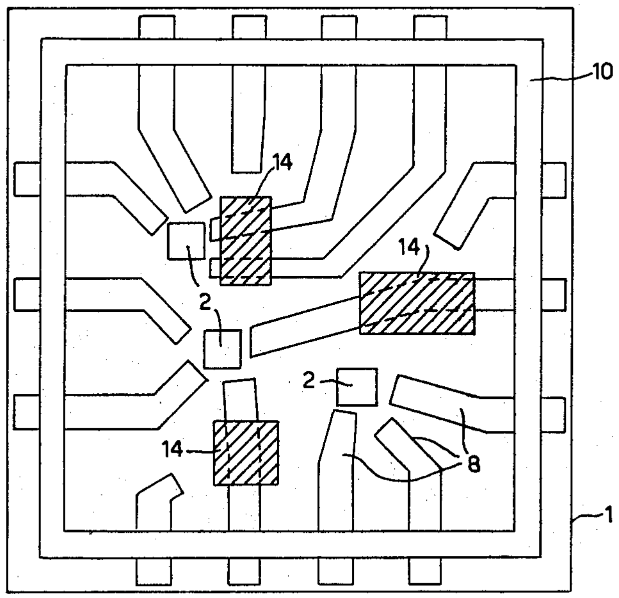
Figure 9D:
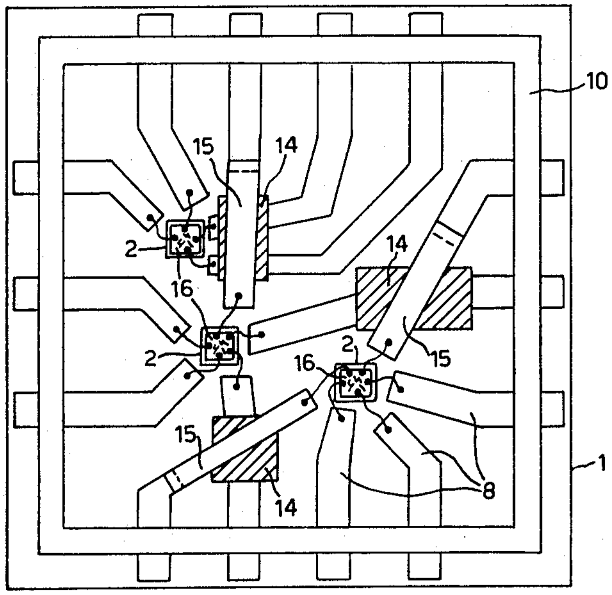

If interconnection must be achieved in two or more layers inside the container, the various layers of insulating material and of conductive material, which consist in each case of commercially available pastes, are printed in succession in the zone intended to be closed, care being taken to choose materials which accept firings at progressively decreasing temperatures. The relevant sequence for the silk screen printing of the various layers is illustrated in FIGS. 9*a* –9*d*. FIG. 9*a* illustrates the silk screen printing of a first layer of printed conductors 8; FIG. 9*b* 8*a* – 8*b* illustrates the silk screen printing of an insulating glass frame 10; FIG. 9*c* illustrates the silk screen printing of a layer of glass 14 for insulation between conductors which cross one another; and FIG. 9*d* illustrates the silk screen printing of a second layer of printed conductors 15 for the interconnections in the central zone of the base 1 and the relevant connections with MOS circuits 16 fixed to central platforms 2. During these stages, there can also be printed these central platforms 2 of pastes suitable for accepting eutectic gold-silicon soldering in the central zone in which it is intended to solder the integrated circuit blocks by this technique and beds 17 (also with a plurality of layers) designed to increase the thickness of the paste in those zones in which the soldering conditions require this (FIGS. 7, 8*a*–8*c*). FIG. 8*a* shows the base 1 with the layer of conductors 8 printed during a first silk screen printing stage; FIG. 8*b l shows a first layer of the central beds 17 partly superposed on the inner ends of the printed conductors 8, and a central platform 2 obtained in a second silk screen printing stage; FIG. 8c* shows a second layer of said central pillows 17 obtained in a third silk screen printing stage.

To define the part reserved for the central interconnections with respect to the peripheral portions 9 to which the lugs 3 of the container must be soldered, the frame 10 of high-melting silk screen printing glass is printed. In view of the firing temperature of this glass (about 950° C), it is printed immediately after the firing of the first layer of printed conductors.

Figure 10:
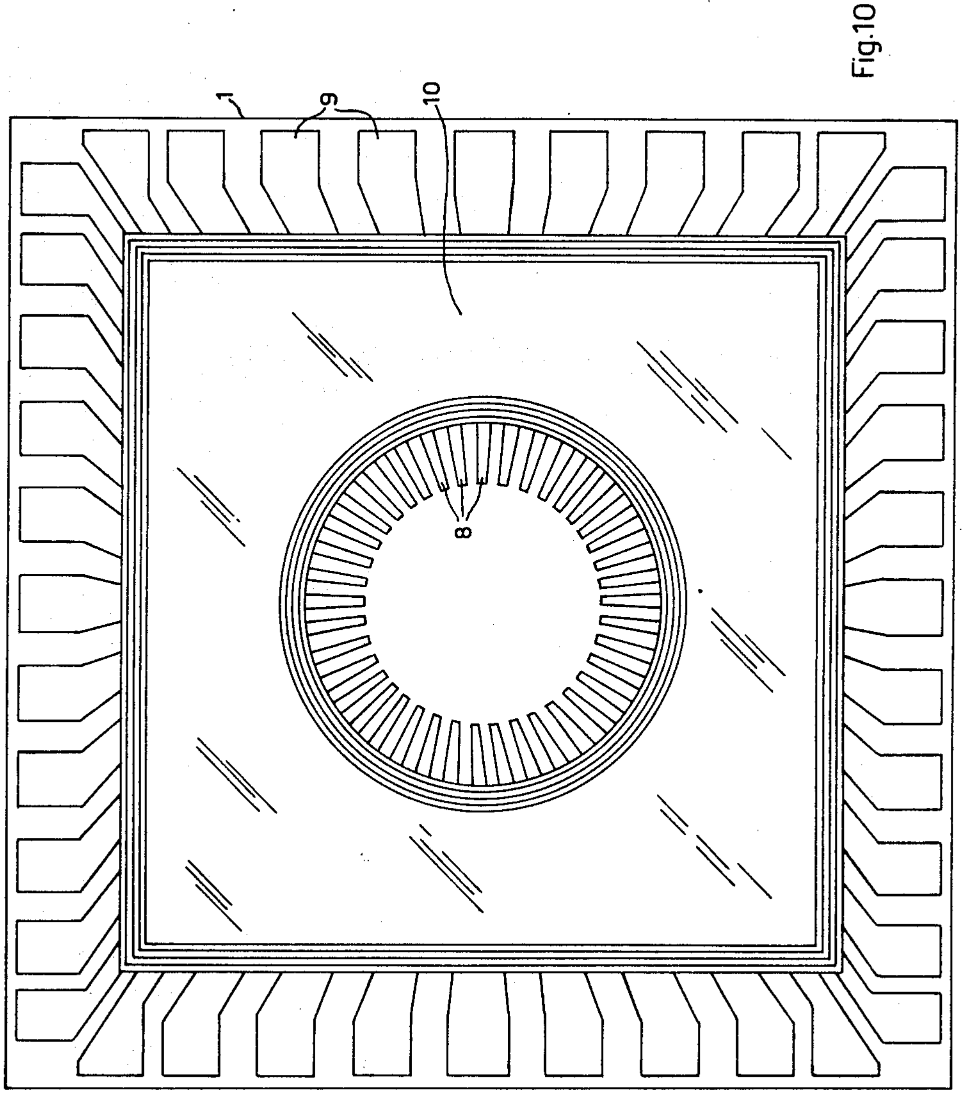
FIG. 10 shows a glass frame included in the containers illustrated in FIG. 2 or FIG. 7.

The thickness of glass frame 10 (which must insulate the interconnections from the protective cover 4) is such as to require more than one layer applied by silk screen printing and it is advisable to fire each layer fully before printing the next. Four layers are recommended (FIG. 10), these being printed with screens of from 130 to 220 mesh, which enable a thickness grater than 0.05 mm to be achieved. This glass frame 10 has three functions; To separate the peripheral conductive portions 9 to which the lugs 3 are soldered from the central zone of the interconnections; to form a barrier to the penetration of moisture which is not subject to mechanical stresses which may be applied to the lugs and which is therefore not liable to cracking; and also to support the subsequently deposited metal ring 6 used for brazing the cover 4, or to accept direct bending of the cover with vitreous or plastics materials. Moreover, the presence of this glass frame 10 makes it possible to avoid completely glass-to-metal welds, which are always the cause of low efficiency. In fact, the welds between the various layers of silk screen printing pastes used are always of the glass-to-glass type.

The shape of the glass frame 10 depends on the shape of the areas which must remain exposed and may vary in the successive printing operations until it assumes the form of the metal soldering ring 6.

The top surface of this glass frame 10 is covered by a silk screen printing process with a gold paste, which serves as a base for the soldering of the protective metal cover 4. If bonding of the cover 4 is effected with an epoxide or silicone resin or with a phenolic resin, this treatment is not necessary.

Only after the closing has been effected, will there be carried out the tin-plating by immersion in Sn-Pb-Ag alloy of the peripheral broadened portions 9 for external connection, to which the lugs 3 are soldered. The last-mentioned operation must be performed after maturing the base 1 for at least 2 hours.

Each container carries four group of lugs, one group per side, by means of which connection is effected between the base to which the integrated circuits are soldered and the printed-circuit board on which the container is mounted.

In the present case, in contrast to normal containers, precise matching of the coefficients of expansion between the material of the lugs and that of the base is not required and it is therefore sufficient to employ for the lugs a material which has good characteristics of unoxidizability and mechanical workability.

Figure 11:
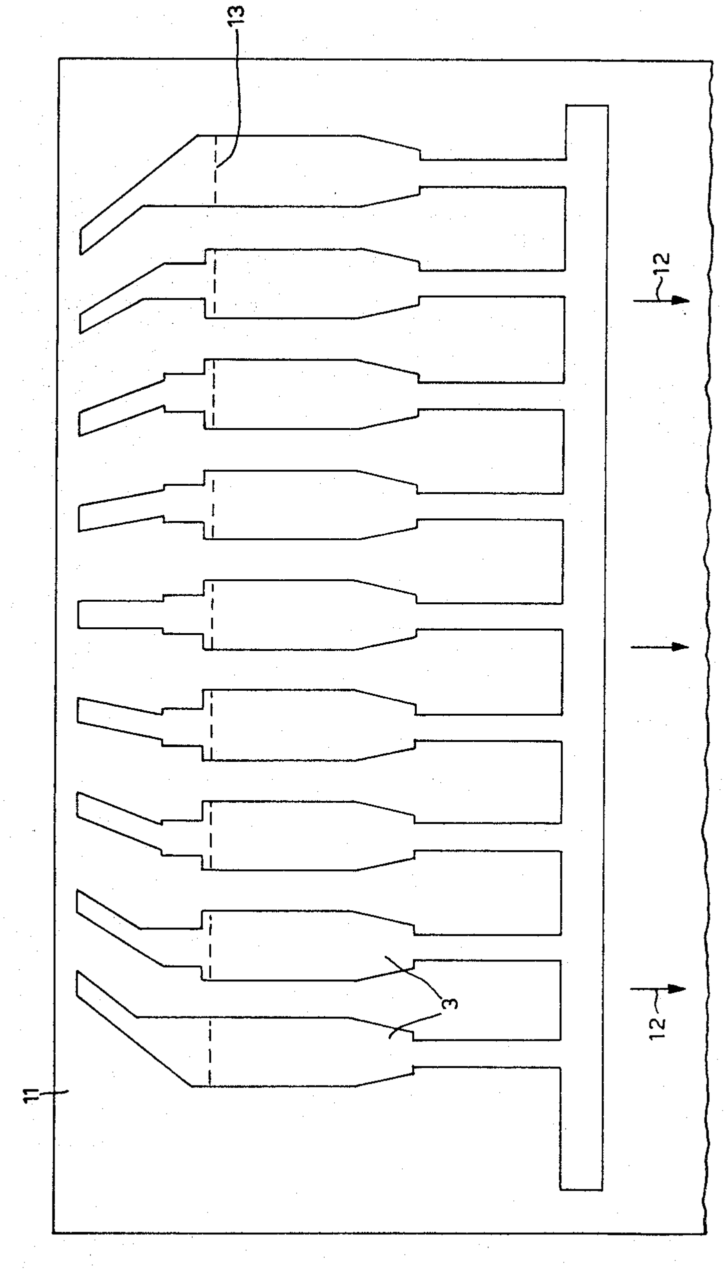
FIG. 11 shows a strip of conductive metal from which the lugs illustrated in FIG. 4 are formed by blanking.

It has been found that optimum results are given by Phosphor bronze in strip form 11 blanked or etched out so that the line of bending 13 of the lugs for mounting on a printed board is perpendicular to the direction of rolling 12 of the strip from which the lugs are formed (FIG. 11).

The container, which has 40 terminals, requires two each of two different groups of lugs, one of nine and the other of 11 lugs (FIG. 4), which are fitted to the short side and the long side, respectively, of the container.

The thickness recommended for the strip 11 from which the lugs are formed is 0.25 mm. The lugs must be gold plated with at least 2 microns of gold and will be pre-tinplated to be soldered to the base with Sn-Pb-Ag alloy. Instead of blanking, it may be convenient to draw that part of the lug which will go into the holes in the printed-circuit plate so as to render this part rigid and give it a form more suitable for soldering (detail of FIG. 4).

Figure 5A:
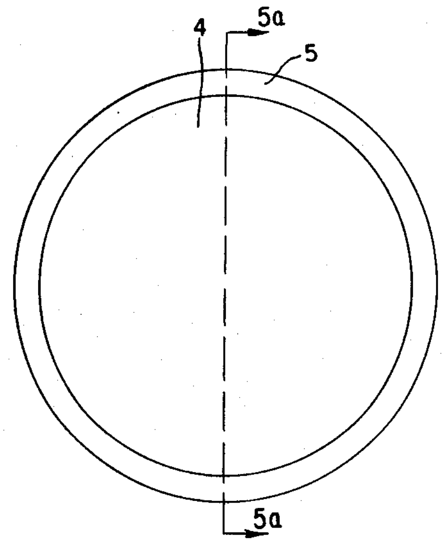
FIGS. 5*a* and 5*a'* and FIGS. 5*b* and 5*b'* show two views, in plan and section, respectively, of two particular constructional forms of a protective cover included in the container illustrated in FIG. 2.
Figure 5B:
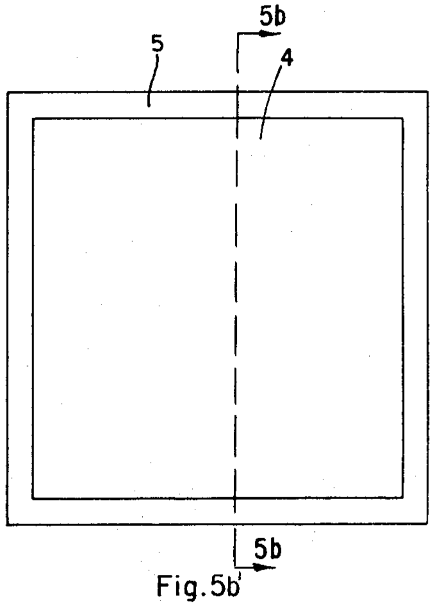
Figure 5A:
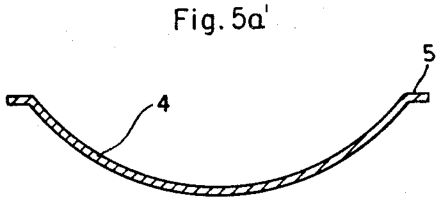
Figure 5B:
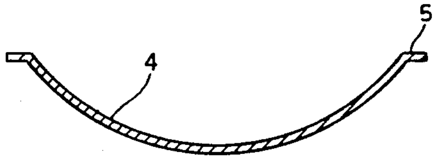
Figure 6:
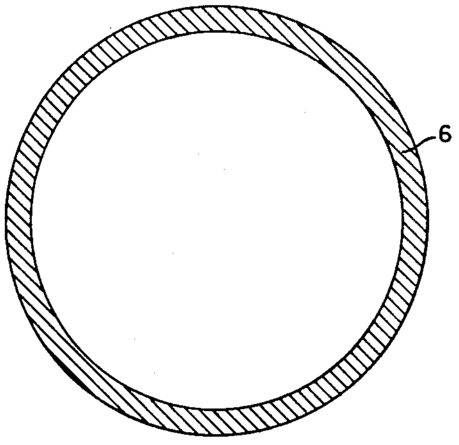
FIG. 6 shows a metal frame used in the container shown in FIG. 2 for soldering the cover illustrated in FIG. 5*a;*

The protective cover 4 must make a very good joint with the ceramic of the base and with the four layers of insulating glass and it is therefore made of Kovar (Trade Mark) alloy having a very low coefficient of thermal expansion. Its form is obtained by the direct stamping and blanking of the alloy sheet and may be varied within wide limits (FIGS. 5*a* and 5*b*). It is essential that there be left at its edges a flat rim 5 with a width of about 1. to 1.5 mm, at which the soldering or bonding to the glass frame 10 will be effected. This rim is gold plated by an electrodeposition process with at least 5 microns of gold, while the remainder of the cover may remain in the original state in the event of the container being encased in plastics material 7, or may be lightly gold plated (for example for a thickness of 2 microns) if the container is to be left uncovered.

The container can be closed with various types of soldered or bonded joints, each of which requires its own kind of preparation.

The closures which give the best guarantees of airtightness make use of metal-to-metal brazed joints. The two layers of gold, that applied by silk screen printing to the glass frame 10 and that applied by electrodeposition to the cover 4, are brazed together with a ring 6 of eutectic Au-Si, Au-Ge or Au-Sn alloy. The maximum temperature acceptable will determine the choice of the alloy (Au-Si 370° C, Au-Ge 356° C, Au-Sn280° C). The brazing may be effected by means of a hot head brought into contact with the surfaces to be soldered or by passage through a furnace. The brazing can also be effected by means of an electric discharge applied with two concentric electrodes to the rim to be soldered.

Alternative solutions to that described may be the following: deposition of an Au-Si, Au-Ge or Au-Sn alloy by silk screen printing on the part to be soldered, which performs the function of the ring 6, thus avoiding the disadvantages of cost and of difficulty of handling thereof; or use of rings 6 made of phenolic resin impregnated paper, which achieve bonding at 120° C and enable the two gold-plating operations to be avoided; or bonding with epoxide resins. The last two solutions are less reliable from the point of view of moisture tightness and impose the need for the resin with which the final encapsulation 7 is achieved to have a high moisture tightness.

The preferable sequence for the assembly of the container is as follows:

a. mounting of one or more integrated semiconductor circuit blocks 16 on the central zone of the ceramic base 1 and, in relation to the maximum temperature acceptable on the part of the semiconductor, the fixing can be effected by soldering with Au-Si or with Au-Sn or by direct cold-cementing with a conductive epoxide resin; of course, in the latter case, there is a loss in quality of electrical base contact and of thermal contact;

b. connection of the terminals of each integrated circuit to the central interconnecting ends of the printed conductors 8; this can be carried out by thermocompression or by ultrasonic soldering;

c. closing of the container by soldering or bonding the protective cover 4 to the glass frame 10 carried by the base 1;

d. tin-plating of the peripheral conductive portions 9 of the base 1; care must then be taken to allow the tin-plated bases to mature or age for at least 2 hours before going on to the following stages of assembly;

e. bending of the lugs 3 at 90°;

f. soldering of one end of the lugs 3 to the peripheral conductive portions 9 by remelting the tinning;

g. encapsulation of the container obtained in this way, with the exception of the free ends of the lugs 3, in plastics material 7.

Figures 4B, 4C:
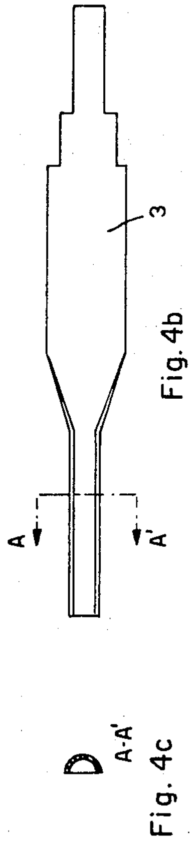
FIGS. 4*a–c* show a series of tags or lugs included in the container illustrated FIGS. 1 and 2, prior to assembly.
Figure 4A:
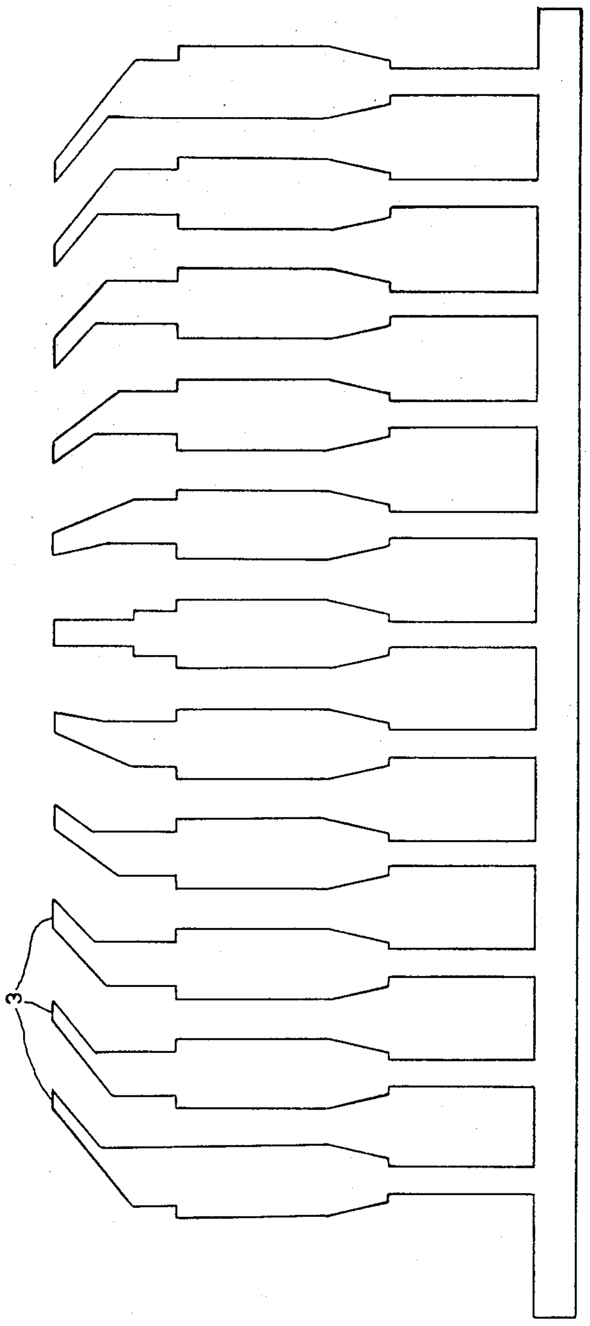

The strips shown in FIGS. 4 and 11 which interconnect the lugs for ease of handling are eventually sheared off.

Another possible solution for mounting integrated circuits in the container is not to have central platforms 2 on the base 1 but to obtain by silk screen printing conductors 8 the inner interconnecting ends of which are disposed in radiating or spoke-like form around the zone in which an integrated circuit will be mounted and which are very close to the position occupied by the terminals of the latter. In this case, conductors are soldered to the terminals of the integrated circuit before it is mounted; thereafter, the integrated-circuit block is deposited inverted in the mounting position, its position being adjusted with respect to the inner interconnecting ends so that the soldered conductors tally with corresponding ends of the printed conductors 8, so that the connection of the soldered conductors with said printed conductors 8 can then be effected by soldering by one of the known techniques, for example the so-called "beam lead" technique. It should be noted that in this kind of mounting the fixing and the mechanical support of the integrated circuit are achieved by this final soldering operation.

Figure 12:
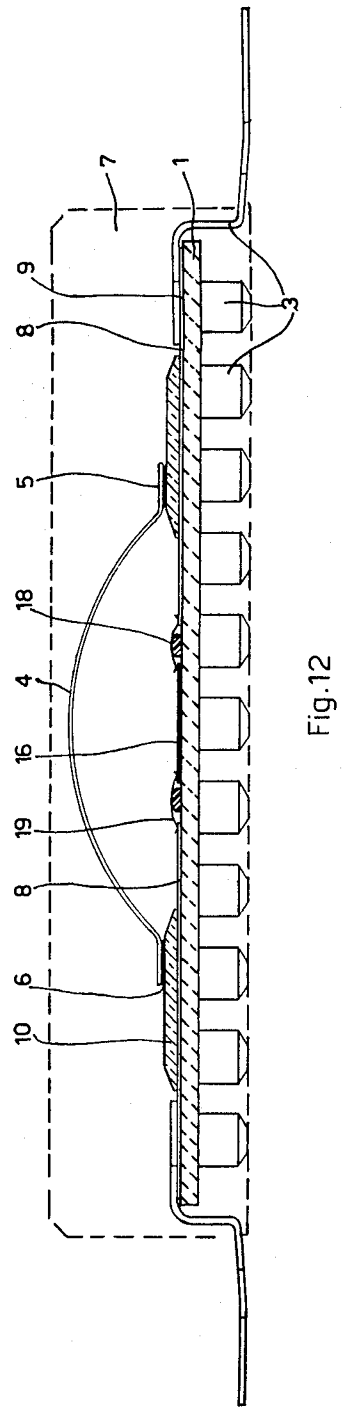
FIG. 12 is a view in section of a third constructional form of the container according to the invention for integrated semiconductor circuits.

Another different solution for the mounting of the integrated circuits in the container is illustrated in FIG. 12, in which there is shown in section a container with coplanar lugs, extending from the side of the container. The drawing shows how the lugs of the container may be bent so as to be parallel to the base of the container, if it is desired to minimize the number of holes in the printed-circuit board on which one or more containers with integrated circuits will be mounted. In this arrangement, the lugs 3 can be soldered as terminals to platforms disposed at a constant pitch on said printed-circuit plate.

In this case of mounting and connection of the integrated circuits with wires soldered by ultrasonics (normal for MOS Circuits, which cannot be brought to a high temperature), the need actually arises to bring the output wires to a level higher than the surface of the integrated circuit so as to avoid the wires themselves being able to short-circuit the integrated circuit by touching the silicon at the edge. Normally, in order to achieve this aim, two methods are followed: either the center of the base 1 is hollowed out so that the integrated circuit 16 is soldered below the plane of the connections, or the connections are produced with sheet metal; in both these cases the cost of the container is considerably increased and in particular in the second case the container is exposed to the risk of fractures of the glass frame 10 which is used for airtight closure.

Figure 13A:
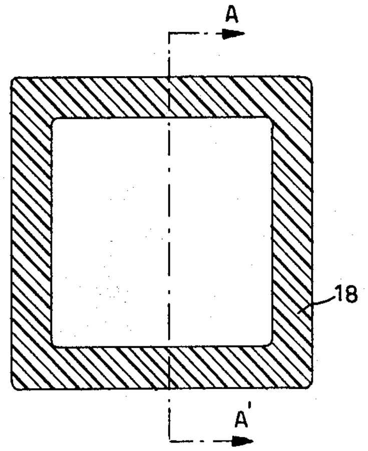
FIGS. 13*a* and 13*b* show a ring of plastics material included in the container illustrated in FIG. 12.
Figure 13B:
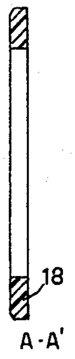

The solution illustrated in FIG. 12 consists simply in placing around the integrated circuit a ring 18 of plastics material which is suitably shaped (for example as in FIG. 13) and suitably cemented to the base 1 with adhesive. The connecting wires 19 leading to the integrated circuit 16 rest on this ring 18 and in this way they are also anchored in position by the effect of the slight tension applied by the soldering machine at the time of setting up. The carrying into effect of this idea is very economical and gives the connections in the container security and stability.

There will now be described a system of assembly which derives directly from the idea of the plastics ring 18 and which permits a substantial economy in the process of assembly. More than one solution using prefabricated elements has been suggested in the literature, but these solutions generally require very strict positioning of the integrated-circuit block with reference to its edge, or they require the handling of the block with the terminals soldered on and subsequent mounting with the face turned downward. This last solution in particular has the fault of entrusting the anchoring of the integrated-circuit block to the electric connection wires.

Figure 14:
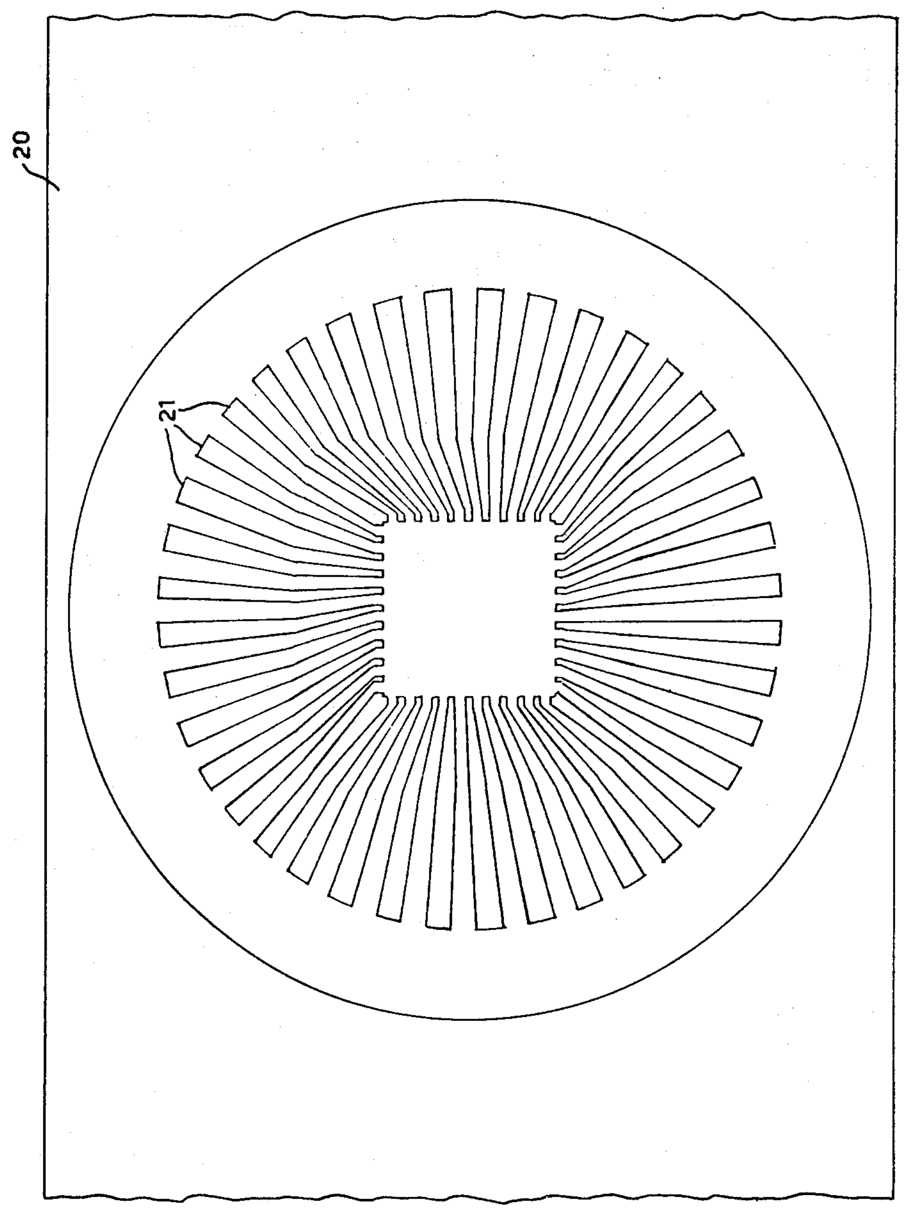
FIG. 14 represents the blanking or punching of connecting tongues included in the container illustrated in FIG. 12 from a strip of conductive metal.
Figure 16:
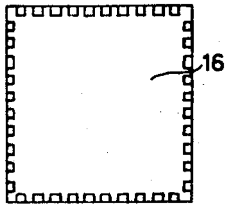
FIG. 16 shows an integrated circuit block to be inserted in the container according to the invention.
Figure 17A:
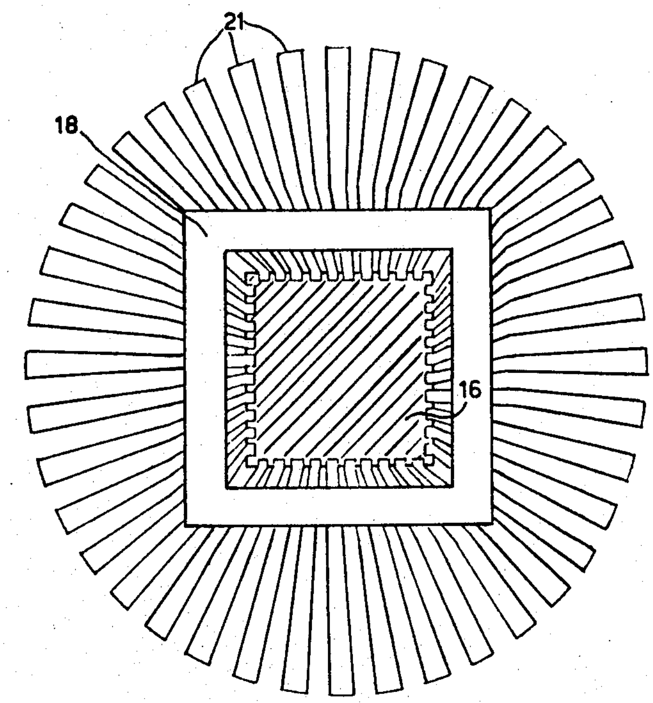
FIG. 17*a* and 17*b* are two views, in plan and section, respectively, of a system of assembly for the framework illustrated in FIG. 15 and the block illustrated in FIG. 16.
Figure 17B:
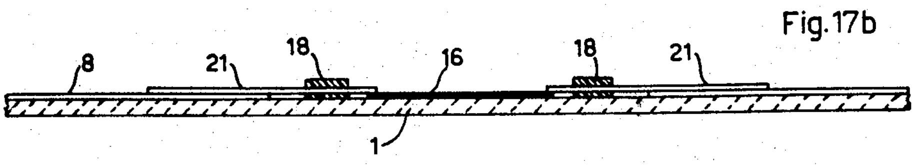

The solution according to the present embodiment of this invention consists in preparing a frame work of aluminum 21 of the type shown in FIG. 14, which is obtained by blanking or by etching from a strip 20 and to which a plastics ring 18 is applied on both faces, as illustrated in FIGS. **17*a* and 17*b***.

Figure 15:
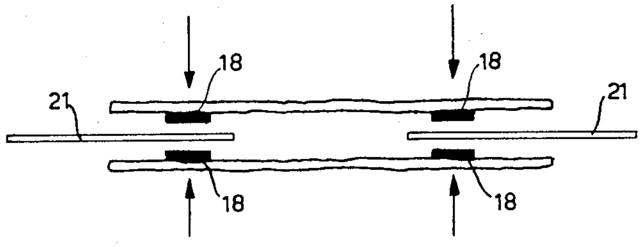
FIG. 15 shows a method of preparing a framework comprising the tongues illustrated in FIG. 14.

The plastics ring 18 may be formed of two parts punched from adhesive insulating tape and applied by pressure to the two faces of the aluminum strip, as indicated in FIG. 15.

This system of assembly requires the exact positioning of the integrated-circuit blocks with respect to the central interconnecting ends of the conductors printed on the base 1, which positioning can be effected with ease at the time of assembly by the use of a reticle suitably engraved in the microscope of the soldering station.

The relevant method of assembly comprises the following stages:

a. the integrated-circuit block is mounted on the base 1 so that its terminals are lined up with the inner interconnecting ends of the printed conductors 8;

b. the framework 21 is mounted, this being already prepared so that the ends of the tongues are exactly positioned and tally with the terminals of the integrated circuit 16 and of the printed conductors 8;

c. with one or at the most two operations of an ultrasonic soldering machine, using a suitably shaped tip, the soldering of the ends of the tongues 21 to the elements tallying therewith is effected.

Figure 2:
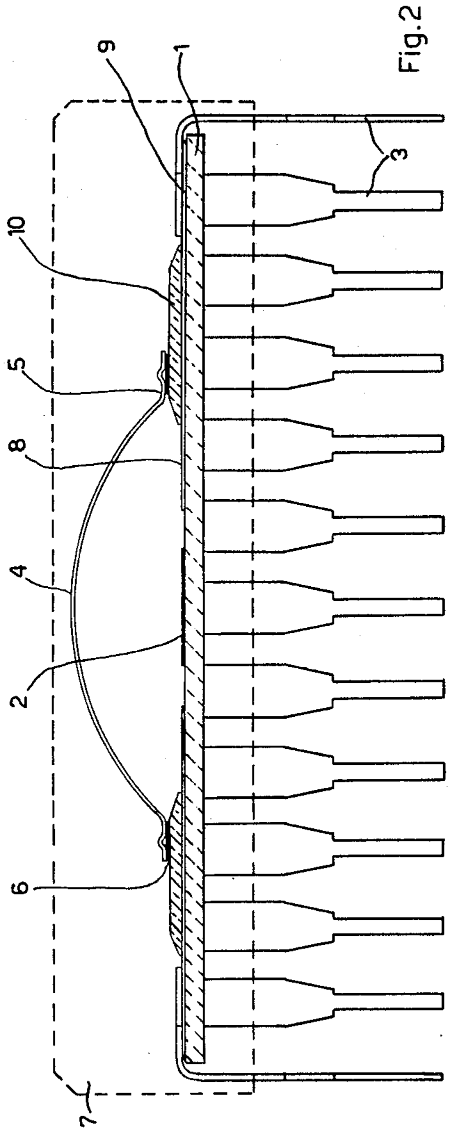
FIG. 2 is a sectional view of a first constructional form according to the invention of the container for integrated circuits which is shown in FIG. 1.
Figure 3:
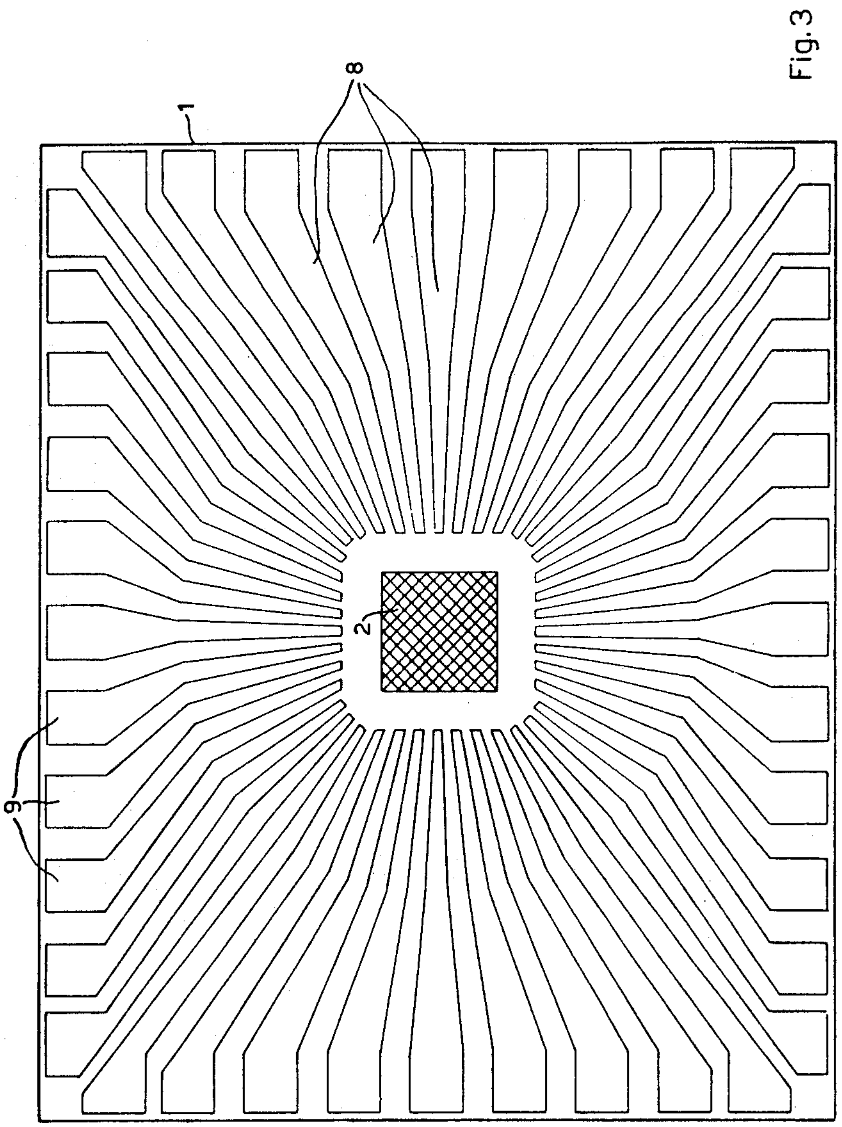
FIG. 3 is a plan view of a base included in the container illustrated in FIG. 2.
Figure 7:
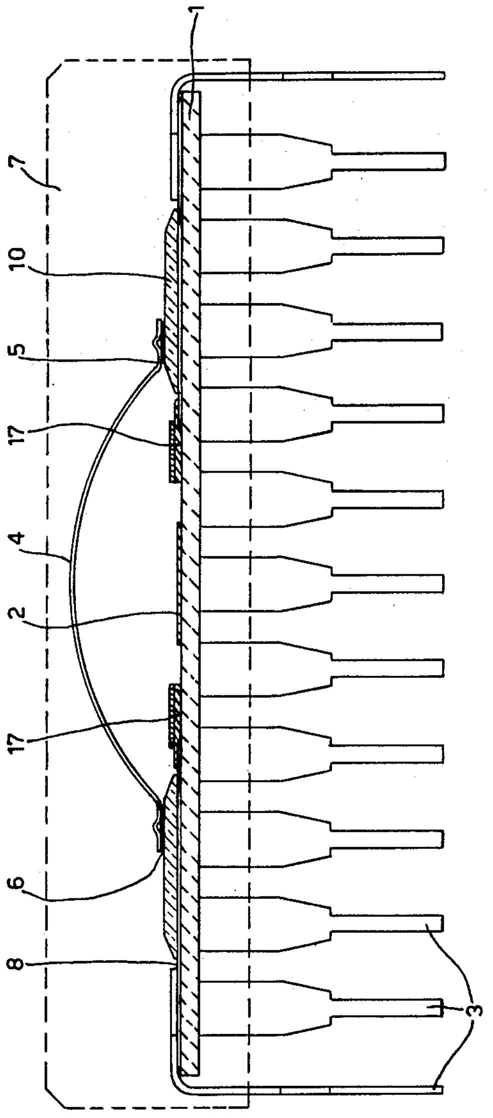
FIG. 7 is a sectional view of a second constructional form according to the invention of the container for integrated circuits which is shown in FIG. 1.

The following stages of assembly are similar to those described with reference to the embodiments of the container which are illustrated in FIG. 2 and FIG. 7.

In order to facilitate assembly, the plastic rings 18 may be shaped in such manner as to bind the interconnecting tongues 21 as much as possible.

The framework 21 may also be made of Al- alloy, if it is desired to be completely secure against oxidation problems.

It should be borne in mind that, once the relevant framework has been mounted, the soldering of the ends of the tongues 21 to the elements tallying therewith may also be obtained by cementing by means of suitable conductive cements.

The saving in cost which can be obtained with this method in the assembly of a container for integrated circuits having 30 – 40 lugs is of the order of 90 percent with respect to the normal assembly obtained by means of connections with single wires.

What is claimed is:

1. In a circuit package containing an active element affixed to a planar substrate and a plurality of conductors printed on said planar substrate and including means for connecting said element to said conductors, the improvement comprising:

means for elevating said connecting means above the surface of said element, said elevating means being located on said substrate between said conductors and said element and between said substrate and said connecting means, said active element, said elevating means, and said printed conductors being co-planar in that said element, said elevating means, and said conductors all rest on the same substantially flat portion of said planar substrate.

2. A method of assembling a portion of a circuit package including an active semiconductor element supported on a planar substrate and a plurality of electrical conduction paths printed on said planar substrate, wherein the improvement comprises:

affixing elevating means on a substantially flat portion of said planar substrate between said paths and said element; and, affixing a plurality of conductors to said element and said paths with said conductors passing over said elevating means, said elevating means being positioned between said element and said paths, said active element, said elevating means, and said paths being co-planar in that said element, elevating means, and conductors all are affixed to the same substantially flat portion of said planar substrate.

3. A semiconductor circuit package for providing protection to enclosed circuit elements and providing electronic communication paths between an external electronic environment and said elements, said package comprising:

a plurality of conductor paths supported by an insulating substrate, said paths comprising a printed film of conductive material;

a closed, glass, insulative frame, said frame surrounding said circuit elements and comprising a printed film of glass deposited over said substrate and said conductor paths, said conductor paths extending from the region internal to said frame to the region external to said frame and passing under said frame;

a layer of conductive material printed over a portion of said frame;

said conductor paths and said conductive layer comprising metal particles in a glass matrix;

means electrically connecting said printed conductor paths to said circuit elements, said paths and said circuit elements being bonded to said connecting means;

means for elevating said connecting means above the edges of said elements, said elevating means being located on said substrate between said conductor paths and said elements and between said substrate and said connecting means, said elevating means comprising an insulating ring adhesively cemented to said substrate; and, a cap brazed to said conductive layer enclosing said circuit elements.

4. A semiconductor circuit package for providing protection to enclosed circuit elements and providing electronic communication paths between an external electronic environment and said elements, said package comprising:

a plurality of conductor paths supported by an insulating substrate, said paths comprising a printed film of conductive material;

a closed, glass, insulative frame, said frame surrounding said circuit elements and comprising a printed film of glass deposited over said substrate and said conductor paths, said conductor paths extending from the region internal to said frame to the region external to said frame and passing under said frame;

a layer of conductive material printed over a portion of said frame;

said conductor paths and said conductive layer comprising metal particles in a glass matrix;

means electrically connecting said printed conductor paths to said circuit elements, said paths and elements being bonded to said connecting means, said connecting means comprising a plurality of metal tongues;

means for elevating said connecting means above the edges of said elements, said elevating means being located on said substrate between said conductor paths and said elements and between said substrate and said connecting means, said elevating means comprising a frame of insulating material, said insulating frame being affixed to said tongues and being positioned between said tongues and said substrate; and, a cap brazed to said conductive layer enclosing said circuit elements.

5. In a circuit package containing an active element affixed to a substrate and a plurality of conductors printed on said substrate and including means for connecting said element to said conductors, the improvement comprising:

means for elevating said connecting means above the surface of said element, said elevating means being located between said conductors and said element and between said substrate and said connecting means, said elevating means comprising an insulating ring and said connecting means comprising wires, said ring being adhesively bonded to said substrate.

6. A package as claimed in claim 5 wherein said insulating ring is plastic.

7. In a circuit package containing an active element affixed to a substrate and a plurality of conductors printed on said substrate and including means for connecting said element to said conductors, the improvement comprising:

means for elevating said connecting means above the surface of said element, said elevating means being located between said conductors and said element and between said substrate and said connecting means, said elevating means comprising an insulating frame and said connecting means comprising metallic tongues, said tongues being affixed to said frame, said frame being located on said substrate.

8. A method of assembling a portion of a circuit package including an active semiconductor element supported by a substrate and a plurality of electrical conduction paths printed on said substrate, wherein the improvement comprises:

affixing elevating means on said substrate between said paths and said elements, and affixing a plurality of conductors to said element and said paths with said conductors passing over said elevating means, which elevating means is positioned between said element and said paths, said elevating means comprising a frame of insulating material, said conductors comprising wires which are located over said frame after said frame is affixed, said elevating means being placed about said circuit element prior to and independently of said conductor affixing step.

9. The package according to claim 8, wherein said tongues are bonded to said active element and said printed conductors.

10. The package according to claim 5, wherein said tongues are bonded to said active element and said printed conductors by means of electrically conductive cement; and, said frame is cemented to said substrate, said active element being affixed to said substrate by said tongues and said frame.

11. A method of assembling a portion of a circuit package including an active semiconductor element supported by a substrate and a plurality of electrical conduction paths printed on said substrate, wherein the improvement comprises:

affixing elevating means on said substrate between said paths and said elements and affixing a plurality of conductors to said element and said paths with said conductors passing over said elevating means, which elevating means is positioned between said element and said paths, said plurality of conductors comprising a plurality of metal tongues, said means for elevating comprising an insulating frame;

said method including affixing said plurality of metallic tongues to said insulating frame and locating said frame on said substrate after said tongues have been affixed to said frame so that said affixed tongues are aligned with said element and said paths.

12. A circuit package comprising:

a. a substrate including a planar surface;

b. an active circuit element supported by said surface;

c. a plurality of printed conductors supported by said surface, said conductors comprising a printed film including metal particles in a matrix of insulative material;

d. a closed frame comprising a film of said insulative material printed over a portion of said substrate and conductors, said frame being limited to leave uncovered the inner and outer ends of said conductors;

e. means for connecting said circuit element to said inner ends of said conductors;

f. elevating means, located between said element and said inner ends of said conductors and between said substrate surface and said connecting means for elevating said connecting means, said elevating means comprising an insulating ring and said connecting means comprising wires, said ring being at least as thick as said element to support said wires above the surface of said element;

g. a protective cap affixed to said closed frame said cap enclosing a region internal to said frame;

h. metallic lugs affixed to said uncovered outer ends of said conductors; and i. a protective encapsulation enclosing said package with the exception of outer portions of said lugs.

13. A package as claimed in claim 12 wherein said insulative material is glass.

14. A package as claimed in claim 13 wherein said insulating ring is plastic.

15. The method according to claim 14, wherein said tongues are bonded to said active element and said connecting means by ultrasonic bonding.

16. A circuit package comprising:

a. a substrate including a planar surface;

b. an active circuit element supported by said surface;

c. a plurality of printed conductors supported by said surface, said conductors comprising a printed film including metal particles in a matrix of non-conductive material;

d. a closed frame comprising a film of said non-conductive material printed over a portion of said substrate and conductors, said closed frame being limited to leave uncovered the inner and outer ends of said conductors;

e. means for connecting said circuit element to said inner ends of said conductors;

f. elevating means, located between said element and said inner ends of said conductors and between said substrate surface and said connecting means for elevating said connecting means, said connecting means comprising metallic tongues, said elevating means comprising an insulating frame, said tongues being affixed to said insulating frame, said insulating frame being affixed to said substrate;

g. a protective cap affixed to said closed frame by means of a metallic layer printed on said frame and a metal preform disposed between said metallic layer and said cap, and enclosing a region internal to said closed frame;

h. metallic lugs affixed to said uncovered outer ends of said conductors; and i. a protective encapsulation enclosing said package with the exception of outer portions of said lugs.

17. A package as claimed in claim 16 wherein said non-conductive material is glass.

18. A package as claimed in claim 17 wherein said insulating frame is plastic.

19. A method of making a circuit package including a semiconductor circuit chip affixed to a substrate, comprising:

printing a plurality of metallization paths on said substrate, said paths extending from a region adjacent to said chip to a region adjacent to the edge of said substrate;

printing a closed frame of insulating material about said chip, said closed frame being printed over said paths leaving exposed the ends of said paths in said regions adjacent to said chip and adjacent to said substrate edge;

locating a wire elevation frame on said substrate in said region adjacent to said chip between said paths and said chip;

affixing wires over said elevation frame to said paths and said chip;

printing a metallic base on a portion of said closed insulating frame;

placing a metal preformed element on said base;

placing a protective cap in contact with said preformed element; and melting said preformed elements to fix said cap to said closed insulating frame.

20. A method of making a circuit package including a semiconductor circuit chip affixed to a substrate, comprising:

printing a plurality of metallization paths on said substrate, said paths extending from a region adjacent to said chip to a region adjacent to the edge of said substrate;

printing a closed frame of insulating material about said chip, said closed frame being printed over said paths leaving exposed the ends of said paths in said regions adjacent to said chip and adjacent to said substrate edge;

affixing a plurality of metal tongues to an insulating elevation frame, said tongues and said elevation frame forming a unitary structure, said tongues being disposed to correspond with the relative locations of said paths and said chip;

affixing said unitary structure to said substrate, said chip, and said paths, said elevation frame being affixed to said substrate, and said tongues being affixed to said chip and said paths;

printing a metallic base on a portion of said closed insulating frame;

placing a metal performed element on said base;

placing a protective cap in contact with said preformed elements; and melting said preformed elements to fix said cap to said closed insulating frame.

* * * * *